United States Patent [19]

Becla

[11] Patent Number: 4,813,049
[45] Date of Patent: Mar. 14, 1989

[54] SEMIMAGNETIC SEMICONDUCTOR LASER

[75] Inventor: Piotr Becla, Arlington, Mass.

[73] Assignee: Massachusetts Institute of Technology, Cambridge, Mass.

[21] Appl. No.: 100,119

[22] Filed: Sep. 23, 1987

[51] Int. Cl.$^4$ .................................................. H01S 3/19
[52] U.S. Cl. ........................................ 372/44; 357/17; 357/61; 372/4; 372/37
[58] Field of Search ..................... 372/43, 44, 37, 4; 357/17, 61

[56] References Cited

U.S. PATENT DOCUMENTS

| | | |
|---|---|---|
| 4,639,756 | 1/1987 | Rosbeck et al. ................ 357/61 |
| 4,689,650 | 8/1987 | Dinan ............................... 357/61 |

OTHER PUBLICATIONS

"The Magnetic Field Influence on the Photovoltaic Effect in Mn Alloyed Semiconductors", J.Vac.Sci.-Technol. A4(4), Jul./Aug. 1986, S. Wong et al.

"LPE Growth Conditions for $Cd_{1-x}Mn_xTe$ and $Hg_{1-x}Mn_xTe$ Epitaxial Layers", J.Vac.Sci.Technol. A3(1), Jan./Feb., 1985, P. Becla et al.

"Infrared Photovoltaic Detectors Utilizing $Hg_{1-x}Mn_xTe$ and $Hg_{1-x-y}Cd_xMnyTe$ alloys",J.Vac.-Sci.Technol A4(4), Jul./Aug. 1986, P. Becla et al.

"Pressure Controlled VPE Growth of Quaternary $Hg_{1-x-y}Cd_xMn_yTe$ Epitaxial Layers", J.Vac.Sci.-Technol. A3(1), Jan./Feb. 1985, P. Becla et al.

*Primary Examiner*—James W. Davie

[57] ABSTRACT

The laser has three regions p-n-n+ or n-p-p+ of magnetic element alloyed Group II–VI elements such as Cd, Hg, and Te doped with an element having a high atomic radius such as Sb or In. The magnetic element may be Mn or Fe. Vapor phase epitaxy is used to create a substrate having graded energy band gap characteristic across its thickness. A two-step liquid phase epitaxy process is used to grow an active layer and a passive layer to create the laser heterostructure. The index of refraction of the active region is higher than the indexes of refraction of the substrate and passive regions. The graded energy band gap and high doping of the substrate region results in a very low resistance which minimizes a temperature rise resulting from joule heating at high current densities. The relationship of the indexes of refraction of the layers result in double sided optical confinement to support lasing. In a semimagnetic semiconductor such as HgMnTe, the coefficient $dE_g/dB$ is large and opposite than in nonmagnetic semiconductors, making it possible to tune the laser by external magnetic fields.

11 Claims, 2 Drawing Sheets

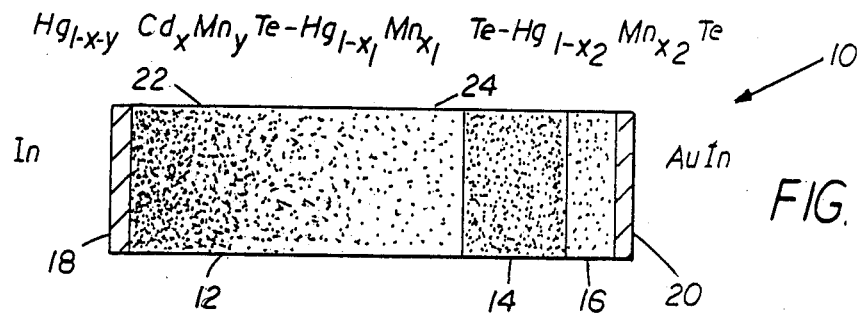
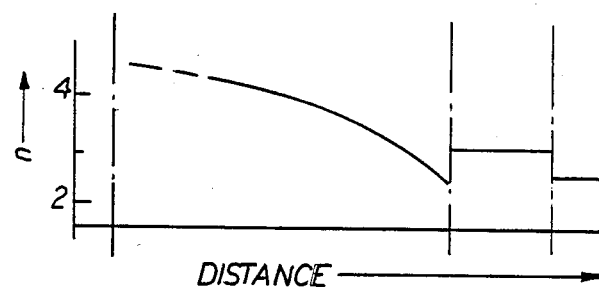
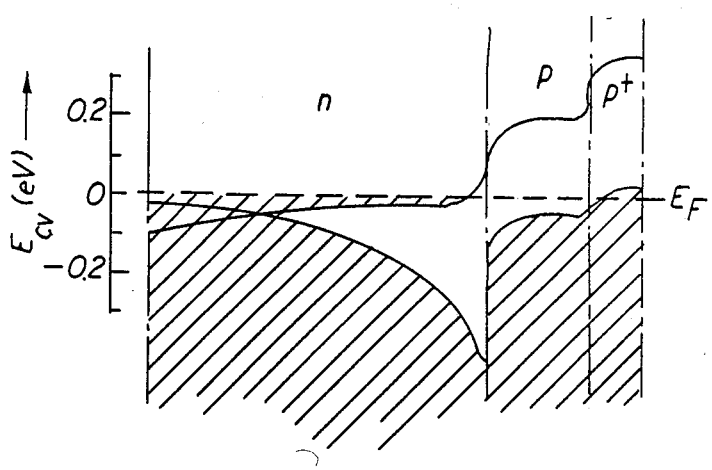
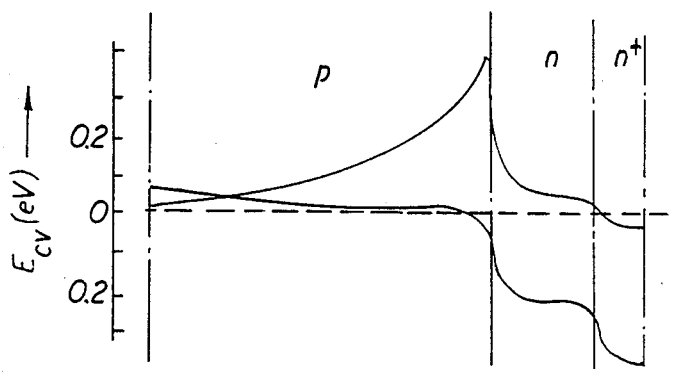
FIG. 1
FIG. 2
FIG. 3
FIG. 4

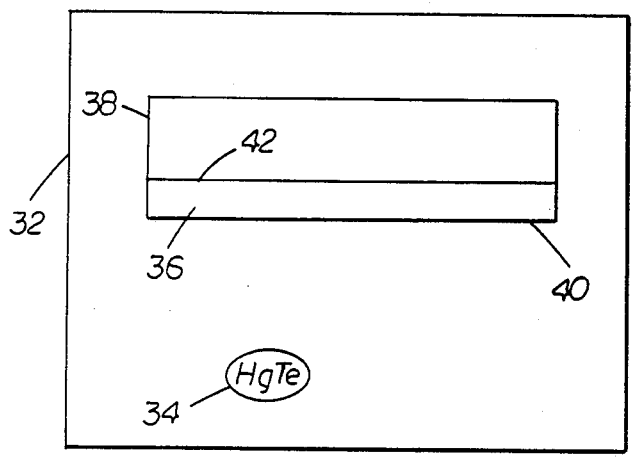
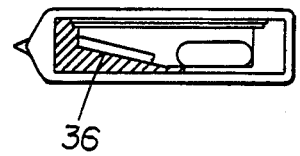
FIG. 5
FIG. 6
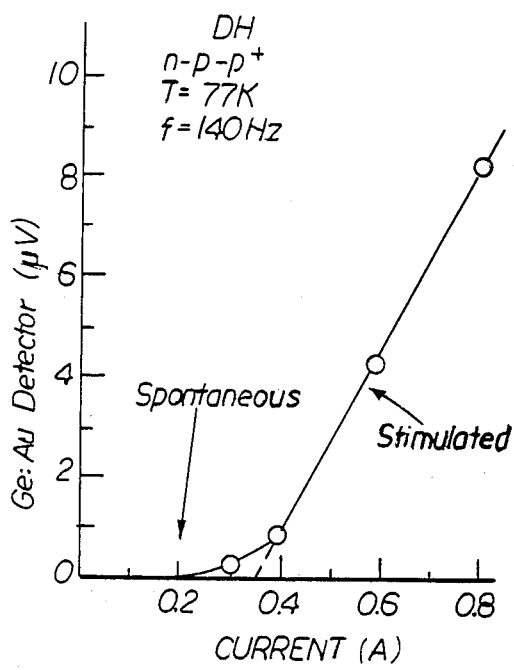
FIG. 7
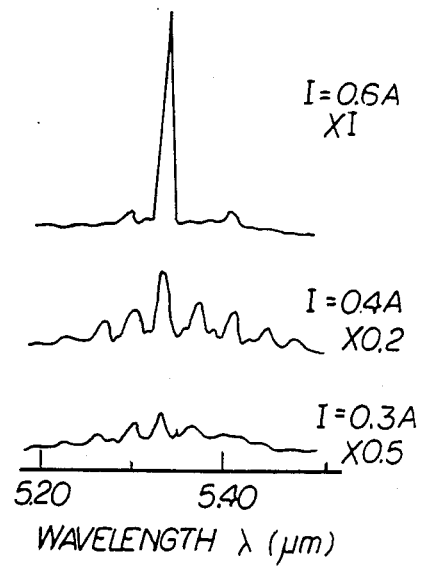
FIG. 8

4,813,049

SEMIMAGNETIC SEMICONDUCTOR LASER

The Government has rights in this invention pursuant to Grant No. N00014-83-K-0454 awarded by the Department of the Navy.

BACKGROUND OF THE INVENTION

This invention relates to innovations in the material and technology of semimagnetic semiconductor lasers.

Semiconductor lasers are known employing Group III-V and IV-VI materials. These known lasers operate in wavelength ranges 0.8–2 $\mu$m and 4–30 $\mu$m leaving a gap in the 2–4 $\mu$m range. Group II-VI semiconductor lasers could fill the need to extend optical communication and other optical systems farther into the infrared and visible regions of the spectrum. Semiconductor lasers require very high current densities to initiate and maintain stimulated emissions. The series resistance of the junctions in semiconductor lasers must therefore be kept very low to avoid dissipating excessive heat at the high current densities. Because the base or substrate in a semiconductor laser is much thicker than the active layer, this region accounts for most of the resistance. Thus, in order to keep the series resistance low, the resistance of the substrate must be reduced while maintaining the appropriate energy band gap with respect to the active layer.

SUMMARY OF THE INVENTION

The semimagnetic semiconductor laser according to the invention includes a substrate of Group II-VI element alloyed with a magnetic element such as Mn or Fe and doped with an element having a high atomic radius such as In, Sb, Tl, or Bi. The substrate region is highly doped and has a graded band gap across its thickness, both the high doping and graded band gap resulting in low resistance. An active region abuts the high band gap side of the graded band gap substrate and a passive barrier region abuts the active region. The index of refraction of the active region is higher than the indexes of refraction of the substrate and passive regions. This index of refraction relationship results in optical confinement to support lasing. The energy band gap of the active layer is lower than the energy band gaps in the active and passive regions.

The semiconductor lasers disclosed herein may be either n-p-p+ or p-n-n+. A preferred embodiment of an n-p-p+ laser has a graded n-type substrate region $Hg_{1-x-y}Cd_xMn_yTe$ highly doped with a high atomic radius element such as indium or thallium. The p-type laser active region is $Hg_{1-x1}Mn_{x1}Te$ and the p-type passive barrier layer is $Hg_{1-x2}Mn_{x2}Te$ doped with an element such as antimony or bismuth. For a p-n-n+ laser, the substrate is doped with antimony or bismuth and the passive barrier layer is doped with indium or thallium. The HgTe-rich side of the graded band gap substrate gives good electrical and thermal contact and the CdMnTe-rich side of the substrate results in a high optical confinement factor. The high doping results in reduced resistivity and since the dopant has a high atomic radius, it prevents atomic interdiffusion. Lasing has been observed at a wavelength of 5.33 $\mu$m at 77° K. at a relatively low pulsed excitation current of approximately 1.3×1.3 kA/cm². Because of a large spin exchange interaction between Mn ions and band electrons and holes, the emitted wavelength is highly dependent on the external magnetic field. Furthermore, because of high negative magnetoresistivity, the quantum efficiency is improved in external magnetic fields.

BRIEF DESCRIPTION OF THE DRAWING

FIG. 1 is a schematic illustration of the semimagnetic semiconductor laser disclosed herein;

FIG. 2 is a graph of index of refraction versus distance across the laser of FIG. 1;

FIG. 3 is a graph of energy band gap as a function of distance across the laser;

FIG. 4 is a graph of energy band gap as a function of distance across a semiconductor laser of the p-n-n type;

FIG. 5 is a schematic illustration of the vapor phase epitaxy process employed in making the laser of the invention;

FIG. 6 is a schematic illustration of the liquid phase epitaxy technique used in the present invention;

FIG. 7 is graph of light output versus excitation current; and

FIG. 8 is a graph of light spectrum near threshold current.

DESCRIPTION OF THE PREFERRED EMBODIMENTS

With reference first to FIG. 1, a laser 10 of the n-p-p type includes a n-type substrate 12, an active p-type layer 14 and a passive p-type layer 16. The laser 10 includes an indium contact 18 and a gold contact 20.

The n-type region 12 is preferably $Hg_{1-x-y}Cd_xMn_yTe$ highly doped with a large atomic radium element such as indium or thallium. The magnetic ion Mn may be replaced by Fe. Importantly, the region 12 has a HgTe-rich portion 22 and a CdMnTe-rich portion 24. This graded composition results in a graded energy band gap across the region 12 as shown in FIG. 3. That is, the energy band gap is low at the HgTe-rich portion 22 and higher at the CdMnTe region 24. Note with reference to FIG. 2 that the index of refraction of the active layer 14 is higher than that of the portion 24 of the region 12 and of the layer 16.

The p-type active layer 14 is $Hg_{1-x1}Mn_{x1}Te$ and the p-type passive layer 16 is $Hg_{1-x2}Mn_{x2}Te$ where x2 is greater than x1. The substrate region 12 is 150 $\mu$m thick, the active layer 14 is 4 $\mu$m thick and the passive layer 16 is 2 $\mu$m thick. The active region 14 is undoped as grown, with net carrier concentration $N_A-N_D$ of about $2\times10^{16}$ cm$^{-3}$, and is sandwiched between the two layers 12 and 16 with higher energy band gap and lower index of refraction. The passive layer 16 is doped with antimony to a concentration level of about $8\times10^{17}$ cm$^{-3}$ and the substrate region 12 is doped with indium to a concentration level of about $3\times10^{18}$ cm$^{-3}$. A p-n-n configuration whose energy band gap is shown in FIG. 4 has the substrate region 12 p-type doped with antimony or bismuth and the passive layer 16 doped with indium or thallium.

The processes used in making the semiconductor laser 10 will now be described in conjunction with FIGS. 5 and 6. First, a single crystal including, for example, Cd, Mn, and Te doped with indium or antimony is grown as by the well-known Bridgman technique. A slice of the crystal material is placed in a chamber 32 which includes a HgTe source 34. The temperature of the chamber 32 is raised to approximately 600° which evaporates the HgTe 34 to form a layer 36 on a substrate 38. This vapor phase epitaxy process results in the layer 36 having a composition $Hg_{1-x-y}Cd_xMn_yTe$ doped with Sb. The doping is carried out during the growth process. Because of interdiffusion processes, a surface 40 of the layer 36 will have higher Hg concentration on the surface and concentration decreases through the thickness of the layer 36. Thus, the surface 40 has a low band gap energy and a surface 42 of the layer 36 has a relatively higher band gap energy. This graded band gap substrate has much lower resistivity than bulk material without the graded band gap characteristic. For a description of the vapor phase epitaxy process used to make the substrate, see, "Pressure Controlled VPE Growth of Quarternary $Hg_{1-x-y}Cd_xMn_yTe$ Epitaxial Layers", P. Becla et al., J. Vac. Sci. Technol., A3(1), January/February 1985 and "Infrared Photo Voltaic Detectors Utilizing $Hg_{1-x}Mn_xTe$ and $Hg_{1-x-y}Cd_xMn_yTe$ Alloys", P. Becla, J. Vac. Sci. Technol., A4(4), July/August 1986. The teachings of these references are incorporated herein by reference.

After the vapor phase epitaxy processing, the substrate 28 is etched away using an etchant such as $HF:HNO_3+H_2O$ leaving the graded band gap layer 36 which will serve as the substrate region 12 of FIG. 1. The active layer 14 and the passive layer 16 are grown by the liquid phase epitaxy method in two steps. As shown in FIG. 6, the layer 36 serves as a substrate in the LPE process. The LPE process is described in "LPE Growth Conditions for $Cd_{1-x}Mn_xTe$ and $Hg_{1-x}Mn_xTe$ Epitaxial Layers", P. Becla et al., J. Vac. Sci. Technol., A3(1), January/February 1985, the teachings of which are incorporated herein by reference. The active layer 14 is grown using an undoped. $(Hg_{0.97}Mn_{0.03})_{0.25}Te_{0.75}$ source solution. The growth temperature was 538° C. with a growth time of five minutes. The passive layer 16 was grown using In or Sb doped $(Hg_{0.95}Mn_{0.05})_{0.25}Te_{0.75}$ source solution. The growth temperature was 570° C. and the growth time was three minutes.

The electrical contacts were made by evaporating Au onto the p-side and In onto the n-side of the laser 10. Individual laser heterostructures were cleaved from the wafer to a size of about $100 \times 200 \times 150$ μm. Spectral dependence of lasing as well as photovoltaic measurements were performed in the temperature range 15° K. to 140° K. using a Perkin-Elmer monochromator.

The graded composition substrate 12 is HgTe-rich at the In contact 18 and CdMnTe-rich at the junction with the active laser region 14. Dopant elements of high atomic number such as In, Tl, Sb, and Bi are used to limit atomic interdiffusion during LPE growth of the laser structures, and the LPE growth period and processing temperatures were minimized. Electroluminescence from a cleaved surface of n-p-p heterostructure was analyzed using square wave current with a repetition rate of 140 hertz. Typical dependence of emitted radiation on excitation current as well as spectra of emitted radiation near the threshold current are presented in FIGS. 7 and 8. Above a current density of 1.2-1.3 $kA/cm^2$ the spectrum becomes characteristic of stimulated emission. The single lasing peak at 77° K. was observed at the wavelength 5.330 μm. The halfwidth of the peak was about $15 \times 10^{-3}$ μm. The threshold current density was found to decrease (by an order of magnitude) and the laser intensity to increase and to shift (on the order of $3 \times 10^{-4}$ eV/K) to lower energy when temperature was lowered to 15° K.

It will be apparent to those skilled in the art that Zn from Group II and Se from Group VI may be utilized for making the lasers disclosed herein. It is intended that modifications and variations of this invention be included within the scope of the appended claims.

What is claimed is:

1. Semimagnetic semiconductor laser heterostructure comprising:

a substrate region of magnetic element alloyed Group II-VI elements doped with a high atomic radius element, the substrate region having a graded energy band gap characteristic across its thickness;

an active region abutting the high energy band gap side of the graded structure region;

a passive region abutting the active region, the index of refraction of the active region being higher than the indexes of refraction in the substrate and passive regions and the energy band gap of the active region being lower than the energy band gap of the substrate and passive regions; and electrodes contacted to the substrate and passive regions, the heterostructure cleaved to form a resonant cavity.

2. The laser of claim 1 wherein the substrate region is $Hg_{1-x-y}Cd_xMn_yTe$ doped with In.

3. The laser of claim 1 wherein the substrate region is $Hg_{1-x-y}Cd_xMn_yTe$ doped with Sb.

4. The laser of claim 1 wherein the magnetic element is Mn.

5. The laser the claim 1 wherein the magnetic element is Fe.

6. The laser of claim 1 wherein the active region is $Hg_{1-x1}Mn_{x1}Te$ and the passive layer is $Hg_{1-x2}Mn_{x2}Te$ where x2 is greater than x1.

7. The laser of claim 1 wherein the Group II elements are Cd and Hg.

8. The laser of claim 1 wherein the Group VI element is Te.

9. The laser of claim 1 wherein the dopant is Bi.

10. The laser of claim 1 wherein the dopant is Tl.

11. Semimagnetic conductor laser heterostructure comprising:

a substrate region of $Hg_{1-x-y}Cd_xMn_yTe$ doped with In, the substrate region having a graded energy band gap characteristic across its thickness;

an active region of $Hg_{1-x1}Mn_{x1}Te$ abutting the high energy band gap side of the graded substrate region;

a passive region of $Hg_{1-x2}Mn_{x2}Te$ abutting the active region, the index of refraction of the active region being higher than the indexes of refraction in the substrate and passive regions and the energy band gap of the active region being lower than the energy band gap of the substrate and passive regions; and electrodes contacted to the substrate and passive regions, the heterostructure cleaved to form a resonant cavity.

* * * * *

UNITED STATES PATENT AND TRADEMARK OFFICE
CERTIFICATE OF CORRECTION

PATENT NO. : 4,813,049
DATED : March 14, 1989
INVENTOR(S) : Piotr Becla

It is certified that error appears in the above-identified patent and that said Letters Patent is hereby corrected as shown below:

Column 1, lines 31-32, "element" should be --elements--;

line 65, "$1.3 \times 1.3$ kA/cm$^2$" should be

--$1.2 \times 1.3$ kA/cm$^2$--.

Column 2, line 30, "radium" should be --radius--.

Signed and Sealed this

First Day of August, 1989

Attest:

Attesting Officer

DONALD J. QUIGG

Commissioner of Patents and Trademarks